United States Patent
Ke et al.

(10) Patent No.: US 11,108,013 B2
(45) Date of Patent: Aug. 31, 2021

(54) DISPLAY SCREEN AND PACKAGING METHOD THEREOF

(71) Applicant: TRULY (HUIZHOU) SMART DISPLAY LIMITED, Guangdong (CN)

(72) Inventors: Xianjun Ke, Guangdong (CN); Xuefeng Zhang, Guangdong (CN); Shengdong Chen, Guangdong (CN); Xiaofeng Zhou, Guangdong (CN); Junhai Su, Guangdong (CN); Jianhua Li, Guangdong (CN)

(73) Assignee: TRULY (HUIZHOU) SMART DISPLAY LIMITED, Guangdong (CN)

( * ) Notice: Subject to any disclaimer, the term of this patent is extended or adjusted under 35 U.S.C. 154(b) by 44 days.

(21) Appl. No.: 16/629,968

(22) PCT Filed: Jun. 13, 2018

(86) PCT No.: PCT/CN2018/091130
§ 371 (c)(1),
(2) Date: Apr. 11, 2020

(87) PCT Pub. No.: WO2019/011100
PCT Pub. Date: Jan. 17, 2019

(65) Prior Publication Data
US 2020/0243797 A1    Jul. 30, 2020

(30) Foreign Application Priority Data
Jul. 12, 2017   (CN) .......................... 201710567413.1

(51) Int. Cl.
*H01L 51/52* (2006.01)
*H01L 27/32* (2006.01)
(Continued)

(52) U.S. Cl.
CPC ...... *H01L 51/5246* (2013.01); *H01L 27/3244* (2013.01); *H01L 51/001* (2013.01);
(Continued)

(58) Field of Classification Search
CPC ............. H01L 51/5246; H01L 51/3244; H01L 51/0011; H01L 51/0017; H01L 51/0027
See application file for complete search history.

(56) References Cited

U.S. PATENT DOCUMENTS

2006/0192487 A1   8/2006   Choi et al.
2009/0009063 A1   1/2009   Botelho et al.
(Continued)

FOREIGN PATENT DOCUMENTS

CN   1826028 A     8/2006
CN   102231428 A   11/2011
(Continued)

OTHER PUBLICATIONS

International Search Report for PCT/CN2018/091130 dated Sep. 25, 2018, ISA/CN.
(Continued)

*Primary Examiner* — Anthony Ho
(74) *Attorney, Agent, or Firm* — Yue (Robert) Xu; Apex Attorneys at Law, LLP

(57) ABSTRACT

The invention relates to a display screen and a packaging method thereof. The packaging method of the display screen comprises the following steps: providing a substrate of the display screen; evaporating an organic light-emitting material on the substrate; printing a first packaging pattern and a second packaging pattern on the cover plate of the display screen, wherein the first packaging pattern surrounds the second packaging pattern; etching the organic light-emitting material by using a first laser on the substrate; fitting the substrate and the cover plate so that the first packaging
(Continued)

pattern and the substrate are fitted, and the second packaging pattern and the organic light-emitting material are fitted; sintering the first packaging pattern and the second packaging pattern by using a second laser on one of the substrate and the cover plate; and performing punching on the display screen.

20 Claims, 12 Drawing Sheets

(51) Int. Cl.
*H01L 51/00* (2006.01)
*H01L 51/56* (2006.01)
*G04B 19/04* (2006.01)

(52) U.S. Cl.
CPC ...... *H01L 51/0011* (2013.01); *H01L 51/0017* (2013.01); *H01L 51/0024* (2013.01); *H01L 51/0027* (2013.01); *H01L 51/0096* (2013.01); *H01L 51/56* (2013.01); *G04B 19/04* (2013.01); *H01L 2227/323* (2013.01)

(56) References Cited

U.S. PATENT DOCUMENTS

| | | |
|---|---|---|
| 2016/0351850 A1 | 12/2016 | Lin et al. |
| 2018/0151846 A1 | 5/2018 | Wang et al. |

FOREIGN PATENT DOCUMENTS

| | | |
|---|---|---|
| CN | 104617234 A | 5/2015 |
| CN | 105576148 A | 5/2016 |
| CN | 205954096 U | 2/2017 |
| CN | 107331797 A | 11/2017 |
| DE | 102008049060 A1 | 4/2010 |
| JP | 2008218393 A | 9/2008 |

OTHER PUBLICATIONS

First Office Action dated Jul. 2, 2018 for Chinese patent application No. 201710567413.1, English summary provided py Unitalen.

DISPLAY SCREEN AND PACKAGING METHOD THEREOF

The present application claims priority to Chinese Patent Application No. 201710567413.1, titled "DISPLAY SCREEN AND PACKAGING METHOD THEREOF", filed on Jul. 12, 2017, with the China National Intellectual Property Administration, which is incorporated herein by reference in its entirety.

FIELD

The present disclosure relates to the technical field of display screen manufacturing, and in particular, to a display screen and a packaging method thereof.

BACKGROUND

With continuous updating of display screen, people have higher and higher requirements for performance of the display screen. Due to product assembly requirements, a conventional display screen needs to be drilled so that the display screen can be applied to drilled-type products.

The conventional AMOLED (Active-matrix Organic Light Emitting Diode) display uses OPEN MASK to deposit an organic material on a substrate by means of evaporation so that an entire surface of a packaging layer of the substrate is covered with the organic material, thus, the packaging layer and the organic material are adhered together. Because the adhesion between the packaging layer and the organic material is so poor as to be prone to penetration of water vapor and oxygen, the adhesion between the substrate and a cover of the display screen is poor and has low reliability. Therefore, AMOLED drilled products cannot be manufacture by the conventional AMOLED packaging method.

SUMMARY

According to various embodiments of the present disclosure, a display screen and a packaging method thereof are provided.

A packaging method of a display screen includes:
providing a substrate of the display screen;
depositing an organic light-emitting material on the substrate by evaporation;
printing a first packaging pattern and a second packaging pattern on a cover of the display screen, where the first packaging pattern surrounds the second packaging pattern;
etching the organic light-emitting material by using a first laser on the substrate;
fitting the substrate with the cover, where the first packaging pattern is fitted with the substrate, and the second packaging pattern is fitted with the organic light-emitting material;
sintering the first packaging pattern and the second packaging pattern by using a second laser on one of the substrate and the cover; and
forming a hole in the display screen.

A display screen is provided, which is packaged by using the aforementioned packaging method of a display screen.

A packaging method of a display screen includes:
providing a substrate of the display screen;
depositing an organic light-emitting material on the substrate by evaporation;
printing a first packaging pattern and a second packaging pattern on a cover of the display screen, where the first packaging pattern surrounds the second packaging pattern;
fitting the substrate with the cover, where the first packaging pattern is fitted with the substrate, and the second packaging pattern is fitted with the organic light-emitting material;
etching the organic light-emitting material by using a first laser on the substrate;
sintering the first packaging pattern and the second packaging pattern by using a second laser on one of the substrate and the cover; and
forming a hole in the display screen.

A display screen is provided, which is packaged by using the aforementioned packaging method of a display screen.

A packaging method of a display screen includes:
providing a substrate of the display screen;
depositing an organic light-emitting material on the substrate by evaporation;
printing a first packaging pattern and a second packaging pattern on a cover of the display screen, where the first packaging pattern surrounds the second packaging pattern;
fitting the substrate with the cover, where the first packaging pattern is fitted with the substrate, and the second packaging pattern is fitted with the organic light-emitting material;
etching the organic light-emitting material and sintering the second packaging pattern by using a first laser on the substrate;
sintering the first packaging pattern by using a second laser on the cover; and
forming a hole in the display screen.

A display screen is provided, which is packaged by using the aforementioned packaging method of a display screen.

Details of one or more embodiments of the present disclosure are set forth in the accompanying drawings and description below. Other features, objects, and advantages of the present disclosure will be apparent from the description, the drawings, and the claims.

BRIEF DESCRIPTION OF THE DRAWINGS

In order to better describe and illustrate embodiments and/or examples of the present disclosure disclosed herein, reference may be made to one or more drawings. The additional details or examples used to describe the drawings should not be considered as limiting the scope of any of the described inventions, the currently described embodiments and/or examples, and the best mode of the inventions currently understood.

DETAILED DESCRIPTION

To facilitate understanding of the present disclosure, the present disclosure will be described more fully hereinafter with reference to the accompanying drawings. The drawings show a preferred embodiment of the present disclosure. However, the present disclosure can be implemented in many different forms and is not limited to the embodiments described herein. Rather, these embodiments are provided to provide a thorough understanding of the present disclosure.

It should be noted that when an element is referred to as being "fixed to" another element, it may be directly on the other element or there may be an intervening element. When an element is referred to as being "connected to" another element, it may be directly connected to the other element or there may be an intervening element.

Unless defined otherwise, all technical and scientific terms used herein have the same meaning as commonly understood by one of ordinary skill in the art to which the present disclosure pertains. The terminology used herein in the description of the present disclosure is for the purpose of describing particular embodiments only and is not intended to limit the present disclosure.

For example, a packaging method of a display screen is provided, including: providing a substrate of the display screen; for example, depositing an organic light-emitting material on the substrate by evaporation; for example, printing a first packaging pattern and a second packaging pattern on a cover of the display screen, where the first packaging pattern surrounds the second packaging pattern; for example, etching the organic light-emitting material by using a first laser on the substrate; for example, fitting the substrate with the cover, so that the first packaging pattern is fitted with the substrate, and the second packaging pattern is fitted with the organic light-emitting material; for example, sintering the first packaging pattern and the second packaging pattern by using a second laser on one of the substrate and the cover; for example, forming a hole in the display screen. For example, a packaging method of a display screen is provided, including: providing a substrate of the display screen; depositing an organic light-emitting material on the substrate by evaporation; printing a first packaging pattern and a second packaging pattern on a cover of the display screen, where the first packaging pattern surrounds the second packaging pattern; etching the organic light-emitting material by using a first laser on the substrate; fitting the substrate with the cover, so that the first packaging pattern is fitted with the substrate, and the second packaging pattern is fitted with the organic light-emitting material; sintering the first packaging pattern and the second packag- ing pattern by using a second laser on one of the substrate and the cover; and forming a hole in the display screen.

Figure 1:
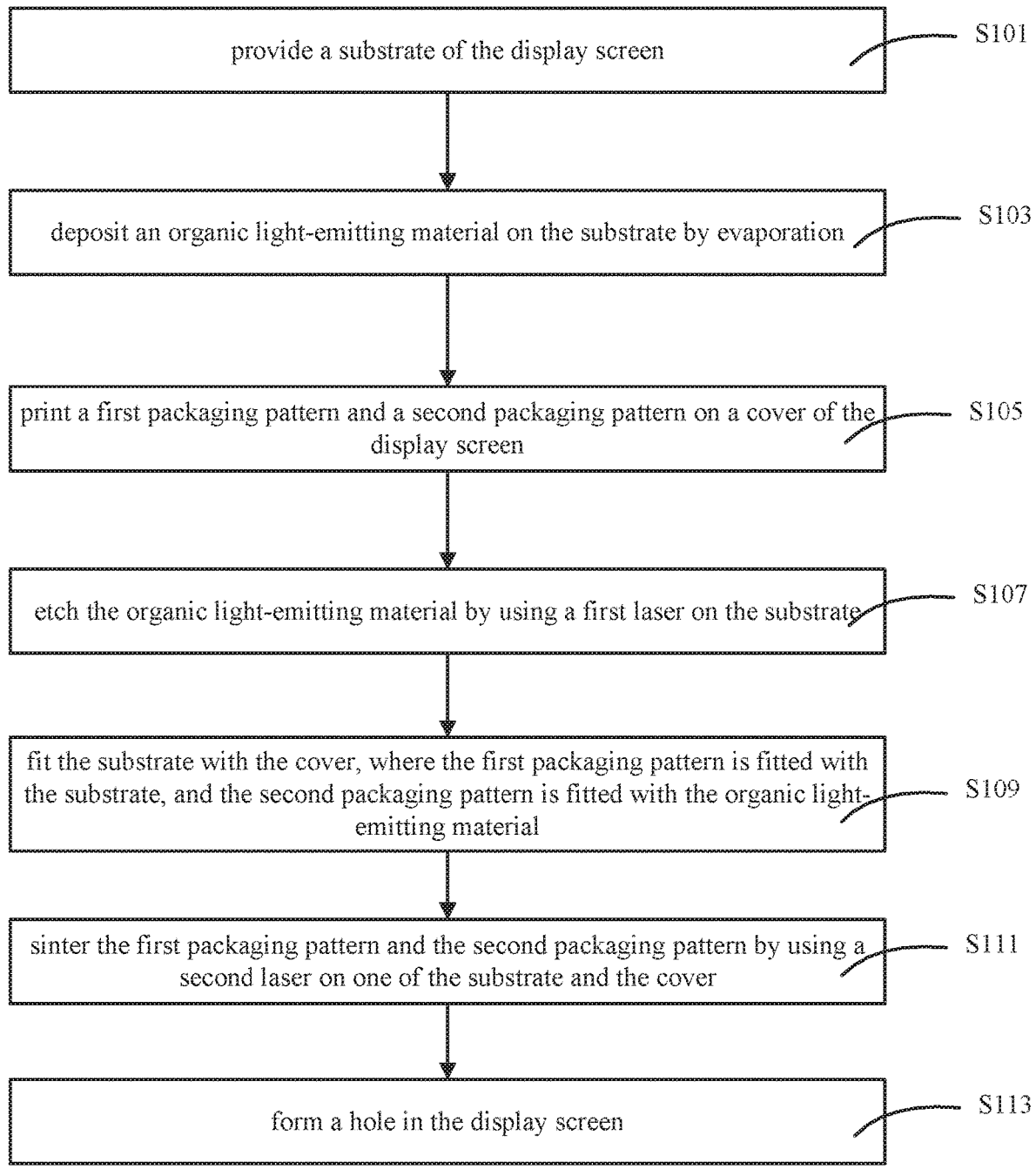
FIG. 1 is a flowchart of a packaging method of a display screen according to a first embodiment of the present disclosure.
Figure 2:
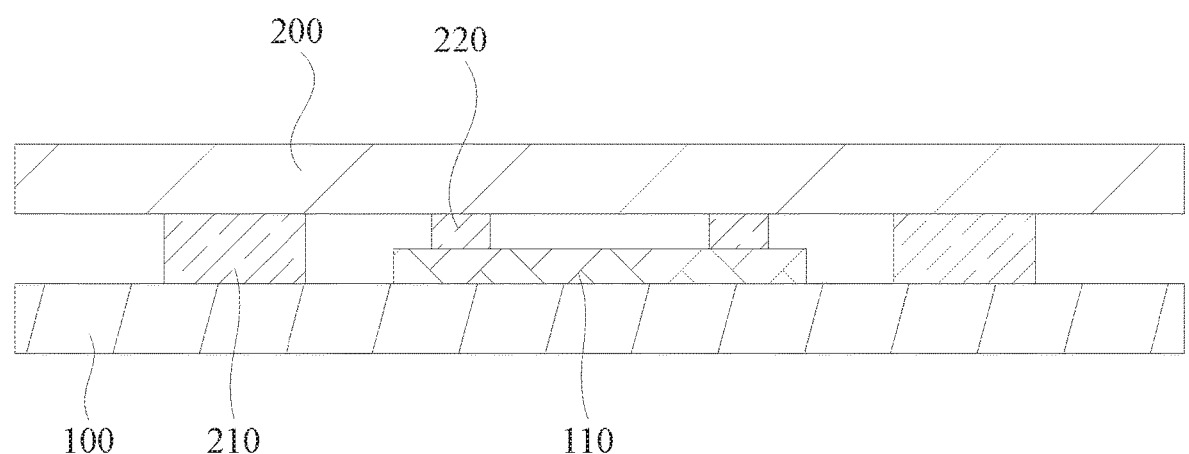
FIG. 2 is a schematic diagram of a packaging process of a display screen.

As shown in FIG. 1, a packaging method of a display screen 10 according to a first embodiment includes:

Referring also to FIG. 2, in step S101, a substrate 100 of the display screen 10 is provided. In the embodiment, the substrate 100 is a glass substrate.

In step S103, an organic light-emitting material is deposited on the substrate 100 by evaporation to form an organic light-emitting layer 110. For example, a functional layer and a cathode of the organic light-emitting layer 110 are deposited by evaporation with an OPEN MASK. The OPEN MASK is a mask for evaporation deposition, which has a large opening that can cover the entire effective display area and requires low accuracy. A light-emitting layer of the organic light-emitting layer 110 is deposited by evaporation with a FINE MASK. The FINE MASK is a mask for evaporation deposition, which has a small opening that covers only light-emitting pixels and requires high accuracy.

Figure 3:
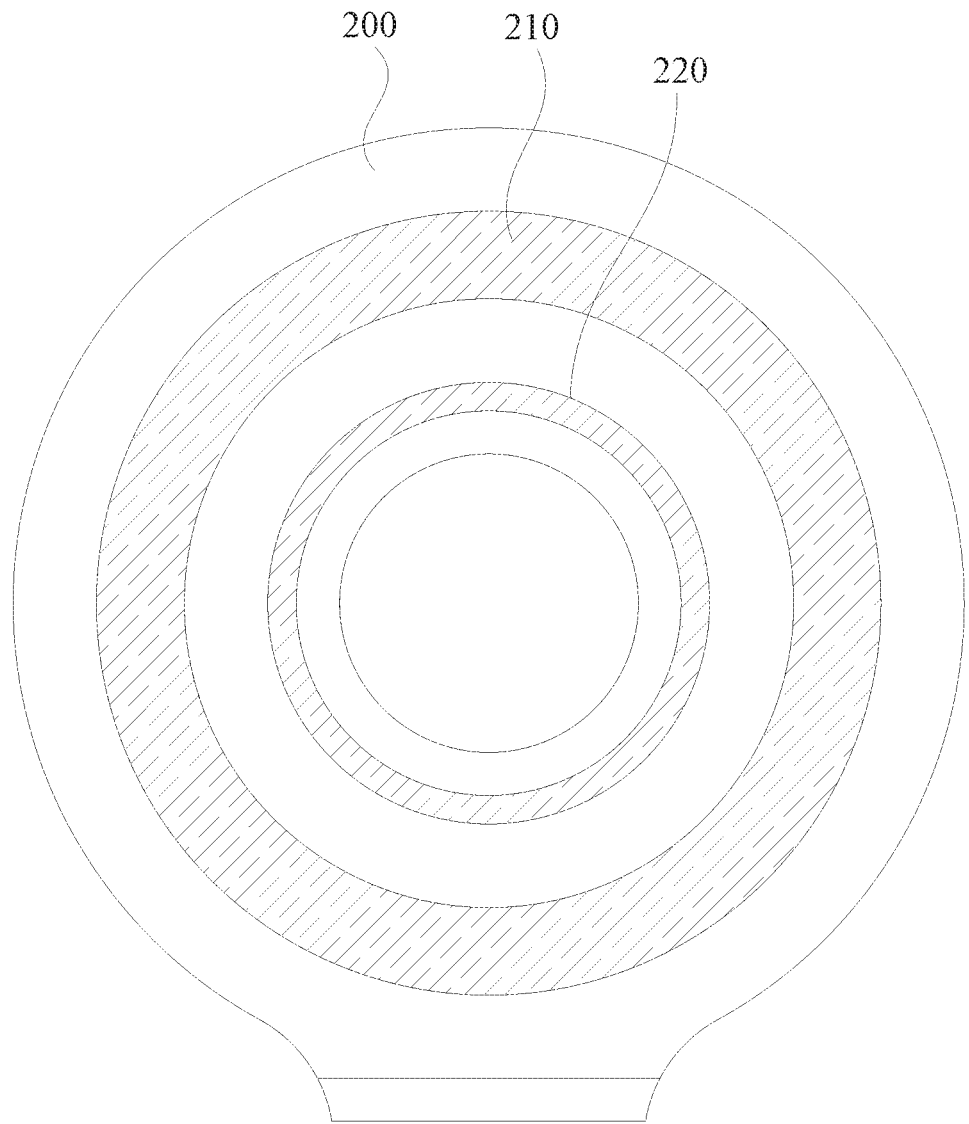
FIG. 3 is a schematic diagram of a cover of a display screen.

As shown in FIG. 3, in step S105, a first packaging pattern 210 and a second packaging pattern 220 are printed on a cover 200 of the display screen 10, where the first packaging pattern 210 surrounds the second packaging pattern 220. In this embodiment, the first packaging pattern 210 and the second packaging pattern 220 are both glass powder packaging patterns. It can be understood that, in other embodiments, the first packaging pattern 210 and the second packaging pattern 220 may also be shadowless glue packaging patterns. For example, the first packaging pattern 210 and the second packaging pattern 220 are both annular, and the first packaging pattern 210 surrounds the second packaging pattern 220. It can be understood that the first packaging pattern 210 and the second packaging pattern 220 are not limited to an annular shape. In other embodiments, the first packaging pattern 210 and the second packaging pattern 220 each have a square shape, an oval shape, a triangular shape, or other shapes. For example, the first packaging pattern 210 and the second packaging pattern 220 are both printed on the cover 200 by screen printing.

Figure 4:
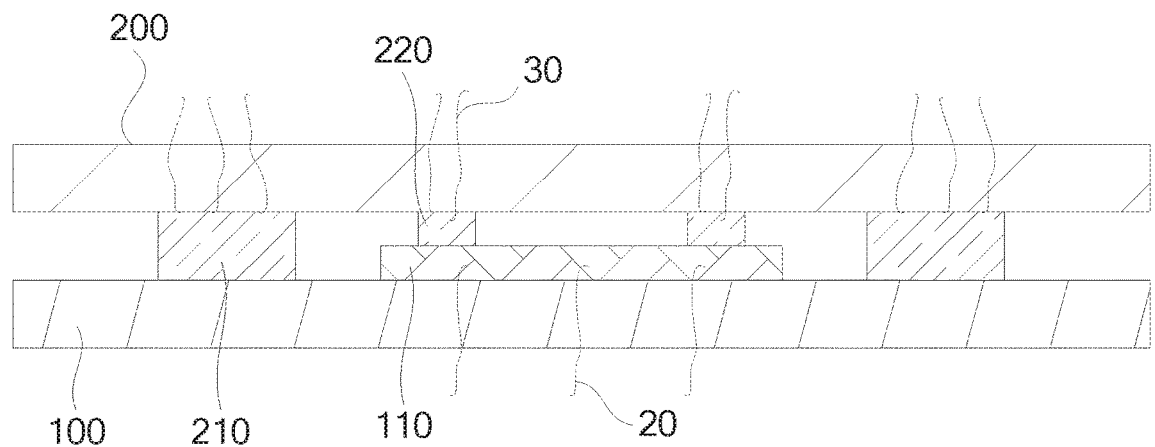
FIG. 4 is another schematic diagram of a packaging process of a display screen.

As shown in FIG. 4, in step S107, the organic light-emitting material is etched by using a first laser 20 on the substrate 100 to remove excess organic light-emitting material on the substrate 100. For example, a laser beam of the first laser 20 acts on the substrate 100 in a direction perpendicular to the substrate 100, so that the first laser 20 quickly removes the organic light-emitting material where the laser beam acts. Apparently, the laser beam of the first laser 20 is not limited to act on the substrate 100 in the direction perpendicular to the substrate 100. For example, an angle between a direction of the laser beam of the first laser 20 and a normal direction of a plane on which the substrate 100 is located is a, where the value of a is greater than zero degrees and less than ninety degrees. In this embodiment, a is equal to forty-five degrees. For example, the first laser 20 acts on a bottom surface of the substrate 100 on which the organic light emitting material is provided.

In step S109, the substrate 100 is fitted with the cover 200, so that the first packaging pattern 210 is fitted with the substrate 100, and the second packaging pattern 220 is fitted with the organic light-emitting material.

In step S111, the first packaging pattern 210 and the second packaging pattern 220 are sintered by using a second laser 30 on one of the substrate 100 and the cover 200, so that the first packaging pattern 210 is in close contact with the substrate 100, and the second packaging pattern 220 is in closer contact with the organic light-emitting material. In this embodiment, the second laser 30 acts on the first packaging pattern 210 to sinter the first packaging pattern 210 so that the first packaging pattern 210 is in close contact with the substrate 100. The second laser 30 acts on the second packaging pattern 220 to sinter the second packaging pattern 220 so that the second packaging pattern 220 is in closer contact with the organic light-emitting material. For example, the first packaging pattern 210 and the second packaging pattern 220 are sintered by using the second laser 30 on the cover 200. For example, the first packaging pattern 210 and the second packaging pattern 220 are sintered by using the second laser 30 on a bottom surface of the cover 200 facing away from the substrate 100, so that the first packaging pattern 210 is in close contact with the substrate 100 and the second packaging pattern 220 is in closer contact with the organic light-emitting material. For example, a laser beam of the second laser 30 is perpendicular to the bottom surface of the cover 200 facing away from the substrate 100, so that the laser beams of the second laser 30 is in equal distance to the first packaging pattern 210 and the second packaging pattern 220, and sintering time of the first packaging pattern 210 and sintering time of the second packaging pattern 220 are equal. Apparently, in other embodiments, it is not limited that the second laser 30 acts on the first packaging pattern 210 and the second packaging pattern 220 through the bottom surface of the cover 200 facing away from the substrate 100.

Figure 5:
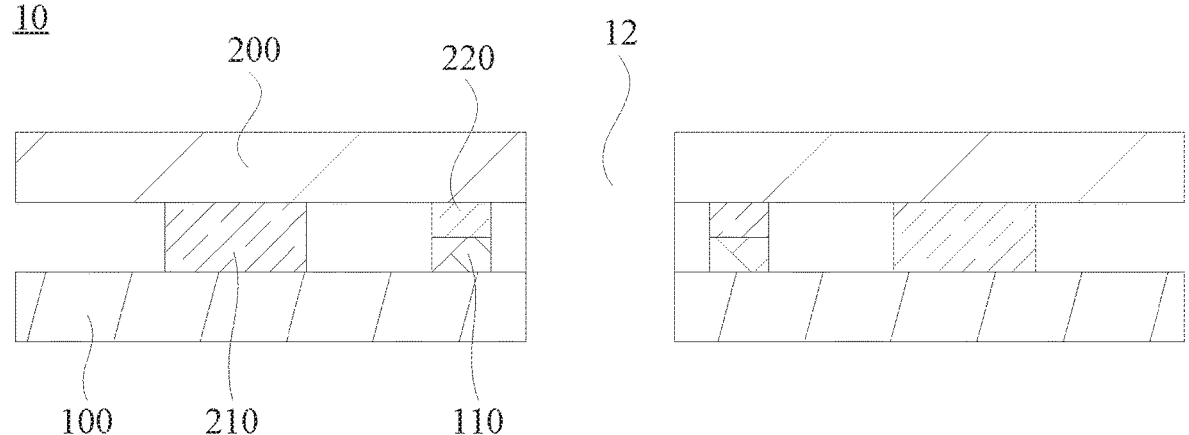
FIG. 5 is an end view of a display screen after being packaged.

As shown in FIG. 5, in step S113, a hole 12 is formed in the display screen 10. In this embodiment, a hole formation device is used to form the hole 12 in the display screen 10 to manufacture a drilled product of the display screen 10. For example, the hole formation device is a computer numerical control machine tool. In other embodiments, the hole formation device may also be a laser hole formation device. In one embodiment, the first packaging pattern 210 and the second packaging pattern 220 are both annular, and the second packaging pattern 220 surrounds the hole of the display screen 10. In this embodiment, a diameter of the first packaging pattern 210 is smaller than that of the second packaging pattern 220, and a center of the first packaging pattern 210 coincides with a center of the second packaging pattern 220. In this embodiment, the display screen 10 is applied to a watch product, where the hole 12 is used for mounting a pointer of the watch. In other embodiments, the display screen 10 may also be applied to a clock product.

Figure 6:
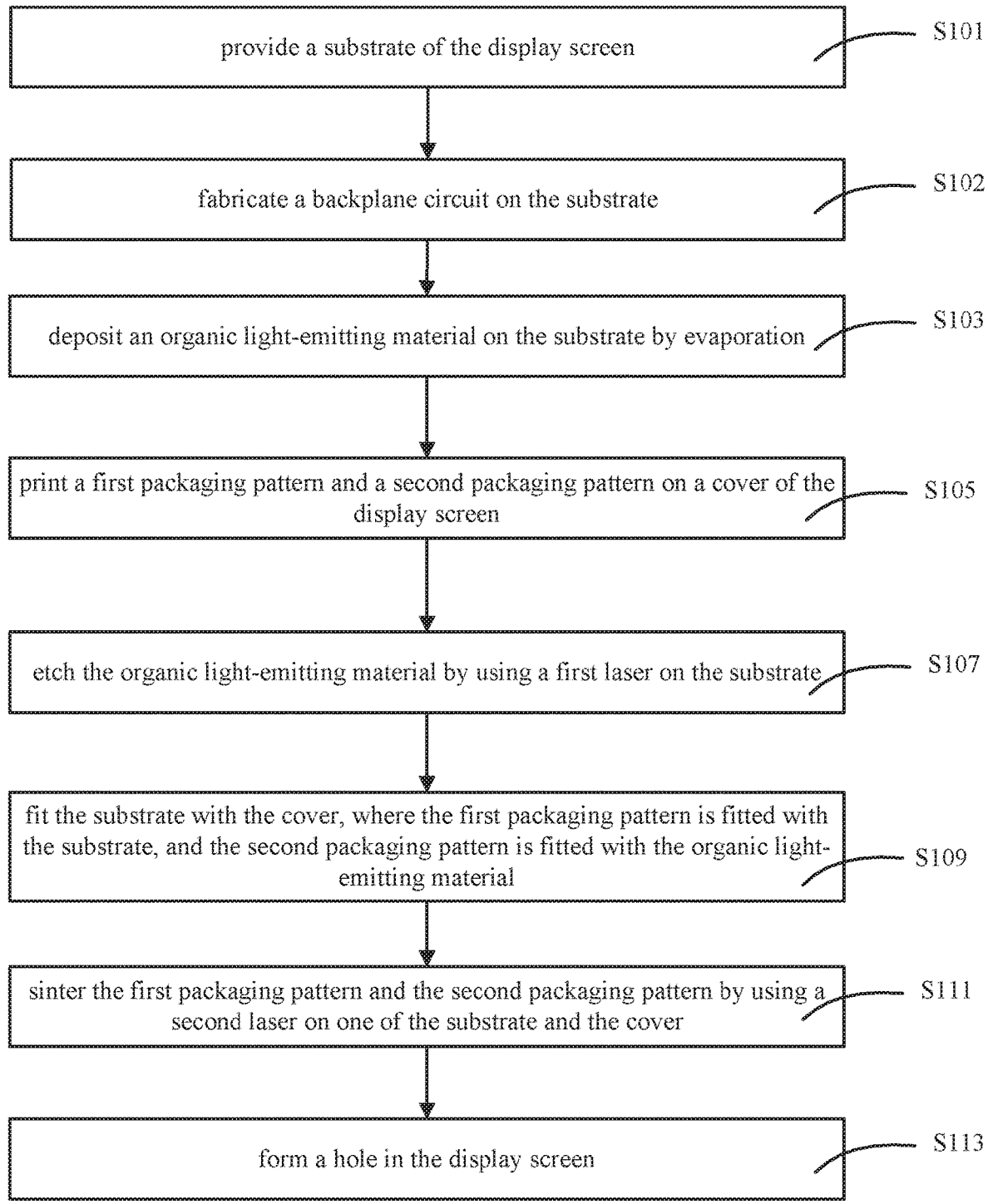
FIG. 6 is another flowchart of the packaging method of a display screen according to the first embodiment of the present disclosure.

As shown in FIG. 6, in one embodiment, before the step S103 of depositing the organic light-emitting material on the substrate 100 by evaporation, the packaging method further comprises: step S102, fabricating a backplane circuit on the substrate 100. In this embodiment, the backplane circuit includes a circuit body and an anode, where the circuit body is electrically connected to the anode. For example, the backplane circuit is fabricated on the substrate 100 by using a low temperature polysilicon technology.

Figure 7:
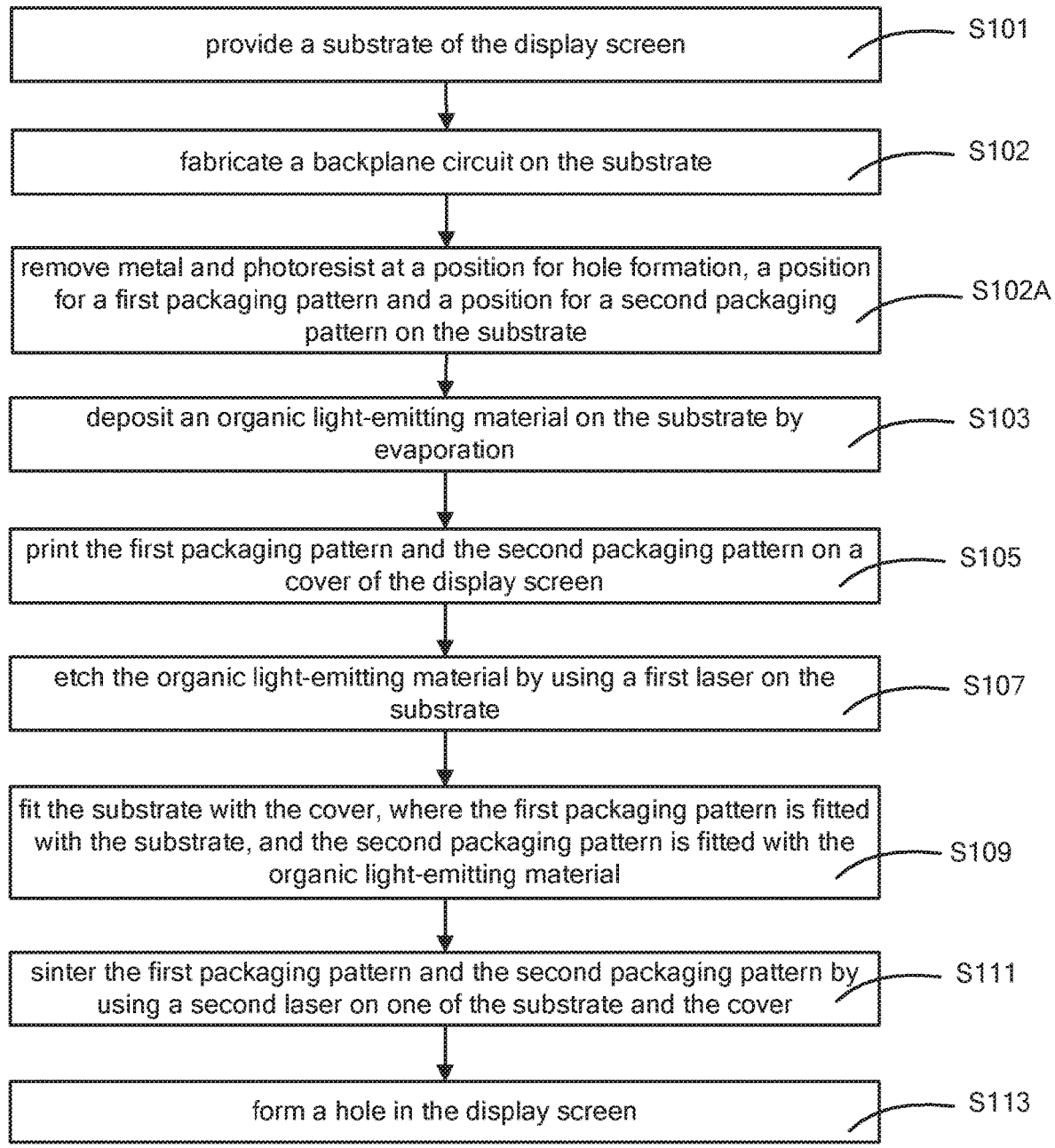
FIG. 7 is another flowchart of the packaging method of a display screen according to the first embodiment of the present disclosure.

As shown in FIG. 7, after the step S102 of fabricating the backplane circuit on the substrate 100, the packaging method further comprises: step S102A, removing metal and photoresist at a position for formation of the hole, a position for the first packaging pattern 210 and a position for the second packaging pattern 220 on the substrate 100, so that the first packaging pattern 210 and the second packaging pattern 220 are better printed on the cover 200.

In the above-described packaging method of the display screen 10, first, the substrate 100 of the display screen 10 is provided; then, the organic light-emitting material is deposited on the substrate 100 by evaporation; then, the first packaging pattern 210 and the second packaging pattern 220 are printed on the cover 200 of the display screen 10; then, the organic light-emitting material is etched by using the first laser 20 on the substrate 100; then, the substrate 100 is fitted with the cover 200, so that the first packaging pattern 210 is fitted with the substrate 100, and the second packaging pattern 220 is fitted with the organic light-emitting material; then, the first packaging pattern 210 and the second packaging pattern 220 are sintered by using the second laser 30 on one of the substrate 100 and the cover 200, so that the first packaging pattern 210 is in close contact with the substrate 100 and the second packaging pattern 220 is in closer contact with the organic light-emitting material; finally, the hole 12 is formed in the display screen 10 to drilled AMOLED display products. The first packaging pattern 210 is fitted with the substrate 100, and the second packaging pattern 220 is fitted with the organic light-emitting material. Because the adhesion between the first packaging pattern 210 and the substrate 100 is better, the adhesion between the substrate 100 and the cover 200 is better, and water vapor and oxygen cannot easily pass between the first packaging pattern 210 and the substrate 100. In addition, since the first packaging pattern 210 surrounds the second packaging pattern 220, the problem of easy transmission of water vapor and oxygen between the packaging layer and the organic material is solved, so that the reliability of the display screen 10 is high.

Figure 8:
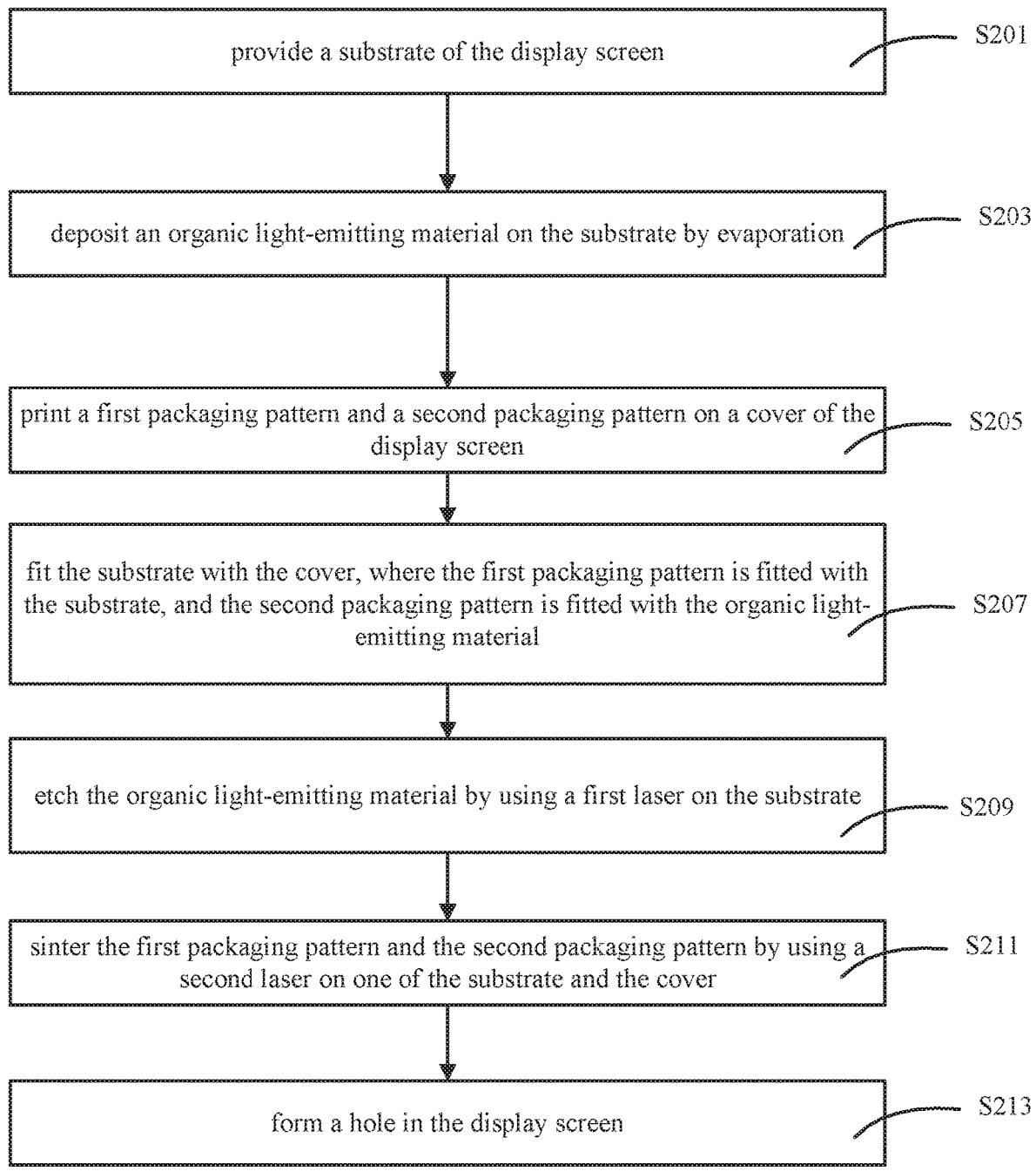
FIG. 8 is a flowchart of a packaging method of a display screen according to a second embodiment of the present disclosure.

As shown in FIG. 8, a packaging method of a display screen 10 is provided according to a second embodiment.

Referring also to FIG. 2, in step S201, a substrate 100 of the display screen 10 is provided. In the embodiment, the substrate 100 is a glass substrate.

In step S203, an organic light-emitting material is deposited on the substrate 100 by evaporation to form an organic light-emitting layer 110. For example, a functional layer and a cathode of the organic light-emitting layer 110 are deposited by evaporation with an OPEN MASK. The OPEN MASK is a mask for evaporation deposition, which has a large opening that can cover the entire effective display area and requires low accuracy. A light-emitting layer of the organic light-emitting layer 110 is deposited by evaporation with a FINE MASK. The FINE MASK is a mask for evaporation, which has a small opening that covers only light-emitting pixels and requires high accuracy.

With further reference to FIG. 3, in step S205, a first packaging pattern 210 and a second packaging pattern 220 are printed on a cover 200 of the display screen 10, where the first packaging pattern 210 surrounds the second packaging pattern 220. In this embodiment, the first packaging pattern 210 and the second packaging pattern 220 are both glass powder packaging patterns. It can be understood that, in other embodiments, the first packaging pattern 210 and the second packaging pattern 220 may also be shadowless glue packaging patterns. For example, the first packaging pattern 210 and the second packaging pattern 220 are both annular, and the first packaging pattern 210 surrounds the second packaging pattern 220. It can be understood that the first packaging pattern 210 and the second packaging pattern 220 are not limited to an annular shape. In other embodiments, the first packaging pattern 210 and the second packaging pattern 220 each have a square shape, an oval shape, a triangular shape, or other shapes. For example, the first packaging pattern 210 and the second packaging pattern 220 are both printed on the cover 200 by screen printing.

In step S207 the substrate 100 is fitted with the cover 200, so that the first packaging pattern 210 is fitted with the substrate 100 and the second packaging pattern 220 is fitted with the organic light emitting material.

With further reference to FIG. 4, in step S209, the organic light-emitting material is etched by using a first laser 20 on the substrate 100. For example, a laser beam of the first laser 20 acts on the substrate 100 in a direction perpendicular to the substrate 100, so that the first laser 20 quickly removes the organic light-emitting material where the laser beam acts. Apparently, the laser beam of the first laser 20 is not limited to act on the substrate 100 in the direction perpendicular to the substrate 100. For example, an angle between a direction of the laser beam of the first laser 20 and a normal direction of a plane on which the substrate 100 is located is a, where the value of a is greater than zero degrees and less than ninety degrees. In this embodiment, a is equal to forty-five degrees. In an embodiment, the first laser 20 acts on a bottom surface of the substrate 100 facing away from the cover 200.

In step S211, the first packaging pattern 210 and the second packaging pattern 220 are sintered by using a second laser 30 on one of the substrate 100 and the cover 200, so that the first packaging pattern 210 is in close contact with the substrate 100 and the second packaging pattern 220 is in closer contact with the organic light-emitting material. In this embodiment, the second laser 30 acts on the first packaging pattern 210 to sinter the first packaging pattern 210 so that the first packaging pattern 210 is in close contact with the substrate 100. The second laser 30 acts on the second packaging pattern 220 to sinter the second packaging pattern 220 so that the second packaging pattern 220 is in closer contact with the organic light-emitting material. For example, the first packaging pattern 210 and the second packaging pattern 220 are sintered by using the second laser 30 on the cover 200. For example, the first packaging pattern 210 and the second packaging pattern 220 are sintered by using the second laser 30 on a bottom surface of the cover 200 facing away from the substrate 100, so that the first packaging pattern 210 is in close contact with the substrate 100 and the second packaging pattern 220 is in closer contact with the organic light-emitting material. For example, a laser beam of the second laser 30 is perpendicular to the bottom surface of the cover 200 facing away from the substrate 100, so that the laser beam of the second laser 30 is in equal distance to the first packaging pattern 210 and the second packaging pattern 220 and sintering time of the first packaging pattern 210 and sintering time of the second packaging pattern 220 are equal. Apparently, in other embodiments, it is not limited that the second laser 30 acts on the first packaging pattern 210 and the second packaging pattern 220 through the bottom surface of the cover 200 facing away from the substrate 100. For example, the first packaging pattern 210 and the second packaging pattern 220 are sintered by using the second laser 30 on a bottom surface of the substrate 100 facing away from the cover 200. In one embodiment, the second laser 30 acts on the bottom surface of the cover 200 facing away from the substrate 100.

With further reference to FIG. 5, in step S213, a hole 12 is formed in the display screen 10. In this embodiment, a hole formation device is used to form the hole 12 in the display screen 10 to manufacture a drilled product of the display screen 10. For example, the hole formation device is a computer numerical control machine tool. In other embodiments, the hole formation device may also be a laser hole formation device. In one embodiment, the first packaging pattern 210 and the second packaging pattern 220 are both annular, and the second packaging pattern 220 surrounds a hole of the display screen 10. In this embodiment, a diameter of the first packaging pattern 210 is smaller than that of the second packaging pattern 220, and a center of the first packaging pattern 210 coincides with a center of the second packaging pattern 220. For example, a shape of the hole 12 is a circular hole, and the center of the hole 12 coincides with the center of the first packaging pattern 210. In this embodiment, the display screen 10 is applied to a watch product, where the hole 12 is used for mounting a pointer of the watch. In other embodiments, the display screen 10 may also be applied to a clock product.

Figure 9:
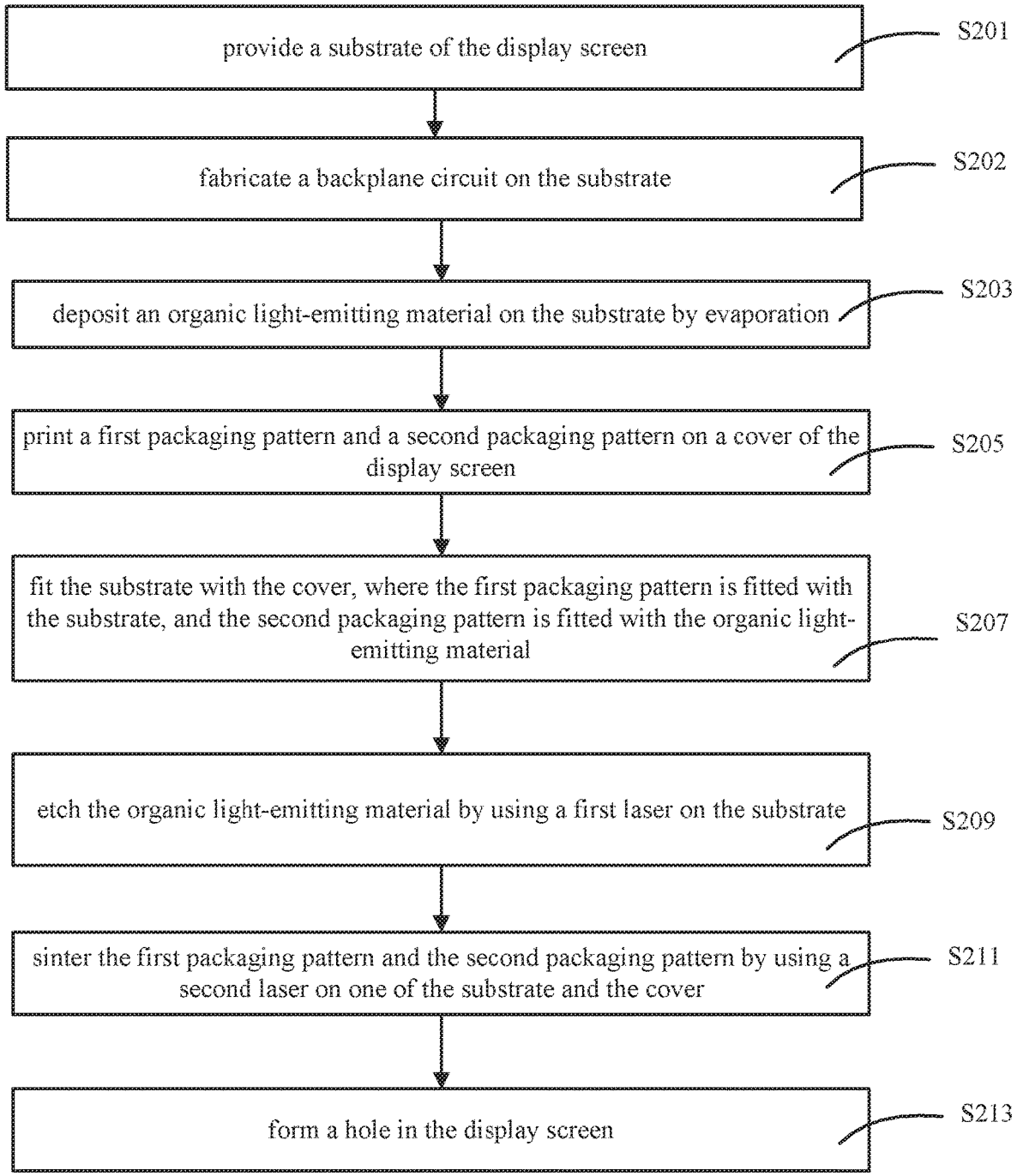
FIG. 9 is another flowchart of the packaging method of a display screen according to the second embodiment of the present disclosure.

As shown in FIG. 9, in one embodiment, before the step S203 of depositing the organic light-emitting material on the substrate 100 by evaporation, the packaging method further comprises: step S202, fabricating a backplane circuit on the substrate 100. In this embodiment, the backplane circuit includes a circuit body and an anode, where the circuit body is electrically connected to the anode. For example, the backplane circuit is fabricated on the substrate 100 by using a low temperature polysilicon technology.

Figure 10:
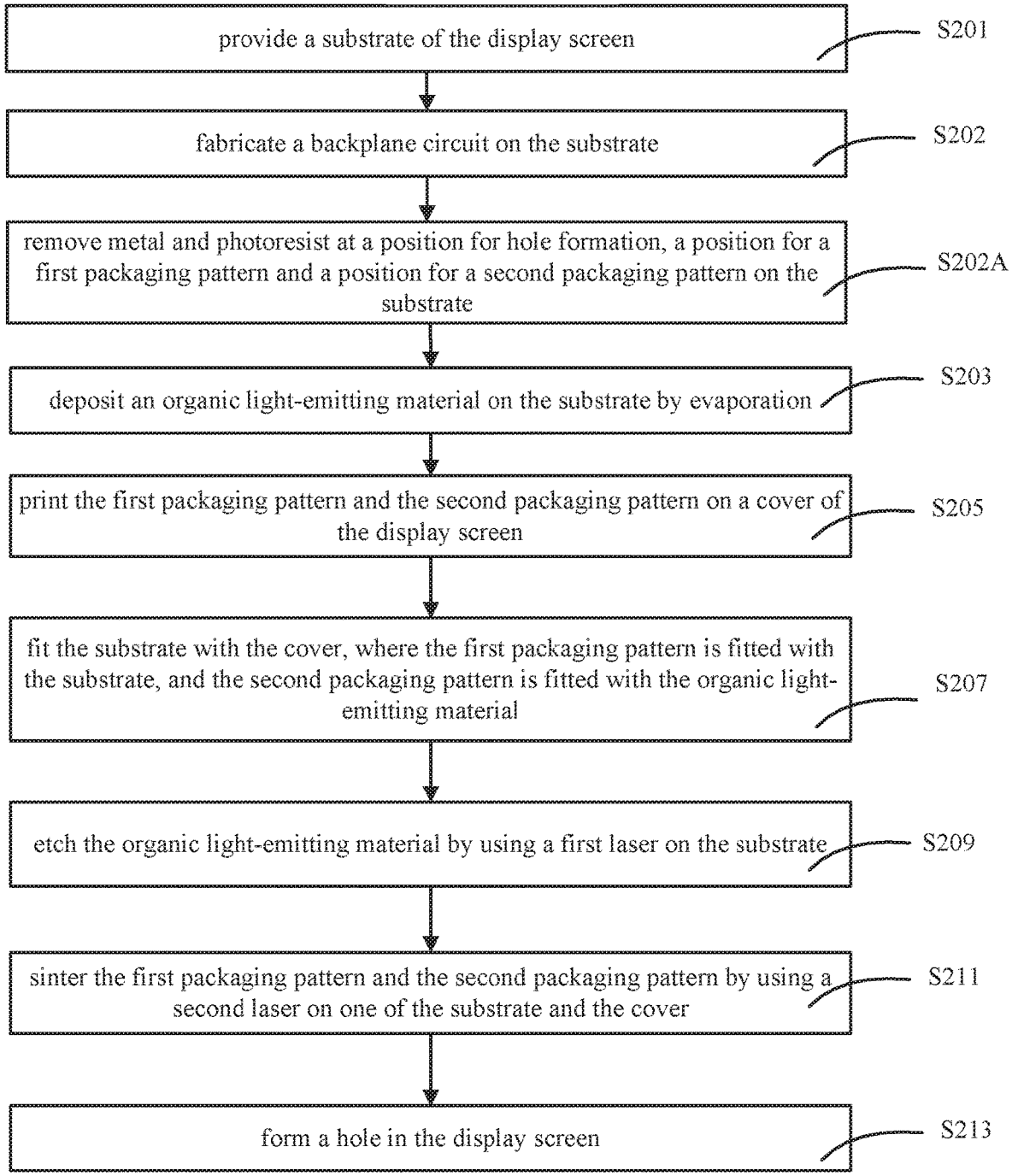
FIG. 10 is another flowchart of the packaging method of a display screen according to the second embodiment of the present disclosure.

As shown in FIG. 10, after the step S202 of fabricating the backplane circuit on the substrate 100, the packaging method further comprises: step S202A, removing metal and photoresist at a position for formation of the hole, a position for the first packaging pattern 210 and a position for the second packaging pattern 220 on the substrate 100, so that the first packaging pattern 210 and the second packaging pattern 220 are better printed on the cover 200.

In the above-described packaging method of the display screen 10, first, the substrate 100 of the display screen 10 is provided; then, the organic light-emitting material is deposited on the substrate 100 by evaporation; then, the first packaging pattern 210 and the second packaging pattern 220 are printed on the cover 200 of the display screen 10; then, the substrate 100 is fitted with the cover 200, so that the first packaging pattern 210 is fitted with the substrate 100 and the second packaging pattern 220 is fitted with the organic light-emitting material; then, the organic light-emitting material is etched by using the first laser 20 on the substrate 100; then, the first packaging pattern 210 and the second packaging pattern 220 are sintered by using the second laser 30 on one of the substrate 100 and the cover 200 so that the first packaging pattern 210 is in close contact with the substrate 100 and the second packaging pattern 220 is in closer contact with the organic light-emitting material; finally, the hole 12 is formed in the display screen 10 to manufacture drilled AMOLED display products. The first packaging pattern 210 is fitted with the substrate 100, and the second packaging pattern 220 is fitted with the organic light-emitting material. Because the adhesion between the first packaging pattern 210 and the substrate 100 is better, the adhesion between the substrate 100 and the cover 200 is better, and water vapor and oxygen cannot easily pass between the first packaging pattern 210 and the substrate 100. In addition, since the first packaging pattern 210 surrounds the second packaging pattern 220, the problem of easy transmission of water vapor and oxygen between the packaging layer and the organic material is solved, so that the reliability of the display screen 10 is high.

Figure 11:
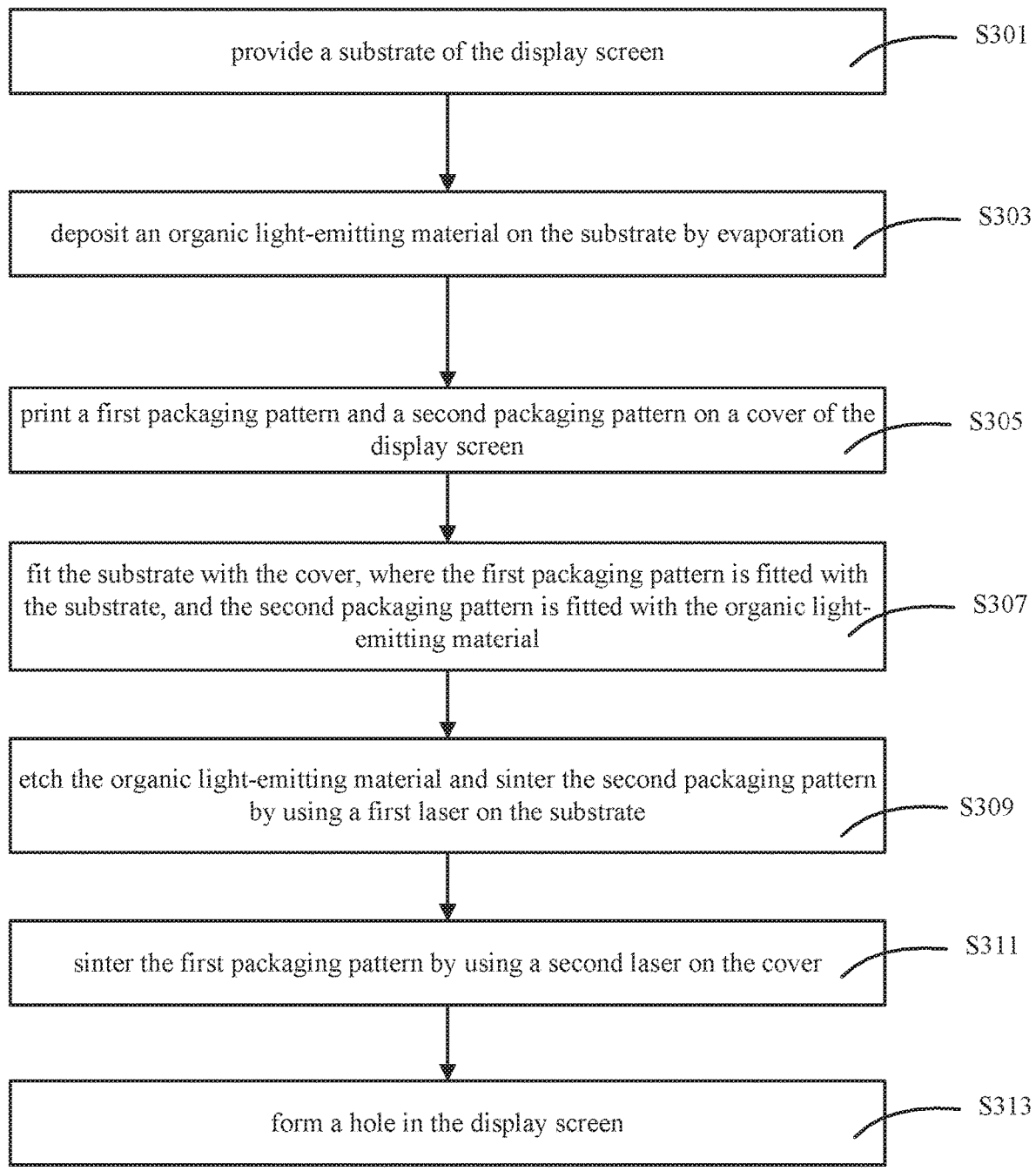
FIG. 11 is a flowchart of a packaging method of a display screen according to a third embodiment of the present disclosure.

As shown in FIG. 11, a packaging method of a display screen 10 is provided according to a third embodiment.

Referring also to FIG. 2, in step S301, a substrate 100 of the display screen 10 is provided. In the embodiment, the substrate 100 is a glass substrate.

In step S303, an organic light-emitting material is deposited on the substrate 100 by evaporation. For example, a functional layer and a cathode of the organic light-emitting layer 110 are deposited by evaporation with an OPEN MASK. The OPEN MASK is a mask for evaporation, which has a large opening that can cover the entire effective display area and requires low accuracy. A light-emitting layer of the organic light-emitting layer 110 is deposited by evaporation with a FINE MASK. The FINE MASK is a mask for evaporation, which has a small opening that can only cover light-emitting pixels and requires high accuracy.

With further reference to FIG. 3, in step S305, a first packaging pattern 210 and a second packaging pattern 220 are printed on a cover 200 of the display screen 10, where the first packaging pattern 210 surrounds the second packaging pattern 220. In this embodiment, the first packaging pattern 210 and the second packaging pattern 220 are both glass powder packaging patterns. It can be understood that, in other embodiments, the first packaging pattern 210 and the second packaging pattern 220 may also be shadowless glue packaging patterns. For example, the first packaging pattern 210 and the second packaging pattern 220 are both annular, and the first packaging pattern 210 surrounds the second packaging pattern 220. It can be understood that the first packaging pattern 210 and the second packaging pattern 220 are not limited to an annular shape. In other embodiments, the first packaging pattern 210 and the second packaging pattern 220 each have a square shape, an oval shape, a triangular shape, or other shapes. For example, the first packaging pattern 210 and the second packaging pattern 220 are both printed on the cover 200 by screen printing.

In step S307 the substrate 100 is fitted with the cover 200, so that the first packaging pattern 210 is fitted with the substrate 100 and the second packaging pattern 220 is fitted with the organic light-emitting material.

With further reference to FIG. 4, in step S309, the organic light-emitting material is etched and the second packaging pattern 220 is sintered both by using a first laser 20 on the substrate 10. For example, a laser beam of the first laser 20 acts on the substrate 100 in a direction perpendicular to the substrate 100, so that the first laser 20 uniformly etches the organic light-emitting material at the laser beam and sinters the second packaging pattern 220, and thereby the adhesion between the second packaging pattern 220 and the organic light-emitting material is relatively uniform. Apparently, the laser beam of the first laser 20 is not limited to act on the substrate 100 in the direction perpendicular to the substrate 100. For example, an angle between a direction of the laser beam of the first laser 20 and a normal direction of a plane on which the substrate 100 is located is a, where the value of a is greater than zero degrees and less than ninety degrees. In this embodiment, a is equal to forty-five degrees. For example, the first laser 20 acts on a bottom surface of the substrate 100 facing away from the cover 200.

In step S311, the first packaging pattern 210 is sintered by using a second laser 30 on the cover 200, so that the first packaging pattern 210 is in close contact with the substrate 100. Specifically, the first packaging pattern 210 is sintered by using the second laser 30 on a bottom surface of the cover 200 facing away from the substrate 100. Further, a laser beam of the second laser 30 acts on the substrate 100 in a direction perpendicular to the cover 200, so that the second laser 30 uniformly sinters the first packaging pattern 210, and thereby, the adhesion between the first packaging pattern 210 and the substrate 100 is relatively uniform. Apparently, the laser beam of the second laser 30 is not limited to act on the substrate 100 in the direction perpendicular to the substrate 100. For example, an angle between a direction of the laser beam of the second laser 30 and a normal direction of a plane on which the substrate 100 is located is b, where the value of b is greater than zero degrees and less than ninety degrees. In this embodiment, b is equal to forty-five degrees. In one embodiment, the first laser light 20 acts on the bottom surface of the substrate 100 facing away from the cover 200. Apparently, in other embodiments, the second laser 30 may be applied to the first packaging pattern 210 through another position on the cover 200. For example, the second laser 30 may act on the first packaging pattern 210 through a side surface of the cover 200, so that there is an angle c between the laser beam of the second laser 30 and a plane on which the first packaging pattern 210 is located, where the value of c is greater than zero degrees and less than ninety degrees and thereby, an area where the laser beam of the second laser 30 acts on the first packaging pattern 210 per unit time is large, which improves the efficiency of the action of the second laser 30. In this embodiment, c is equal to forty-five degrees.

With further reference to FIG. 5, in step S313, a hole 12 is formed in the display screen 10. In this embodiment, a hole formation device is used to form the hole 12 in the display screen 10 to manufacture a drilled product of the display screen 10. For example, the hole formation device is a computer numerical control machine tool. In other embodiments, the hole formation device may also be a laser hole formation device. In one embodiment, the first packaging pattern 210 and the second packaging pattern 220 are both annular, and the second packaging pattern 220 surrounds a hole of the display screen 10. In this embodiment, a diameter of the first packaging pattern 210 is smaller than that of the second packaging pattern 220, and a center of the first packaging pattern 210 coincides with a center of the second packaging pattern 220. For example, a shape of the hole 12 is a circular hole, and the center of the hole 12 coincides with the center of the first packaging pattern 210. In this embodiment, the display screen 10 is applied to a watch product, where the hole 12 is used for mounting a pointer of the watch. In other embodiments, the display screen 10 may also be applied to a clock product.

Figure 12:
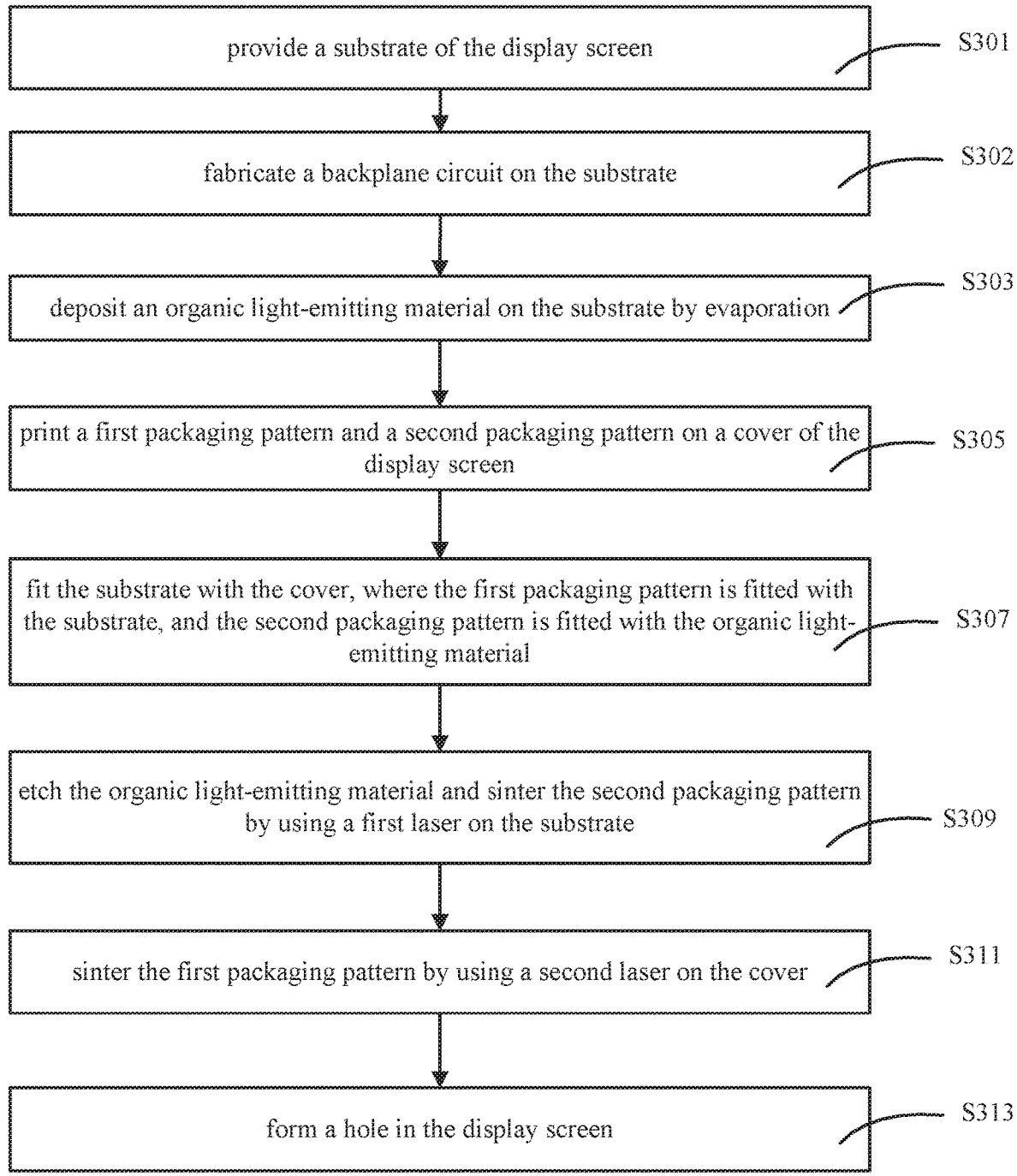
FIG. 12 is another flowchart of the packaging method of a display screen according to the third embodiment of the present disclosure.

As shown in FIG. 12, in one embodiment, before the step S303 of depositing the organic light-emitting material on the substrate 100 by evaporation, the packaging method further comprises: step S302, fabricating a backplane circuit on the substrate 100. In this embodiment, the backplane circuit includes a circuit body and an anode, where the circuit body is electrically connected to the anode. For example, the backplane circuit is fabricated on the substrate 100 by using a low temperature polysilicon technology.

Figure 13:
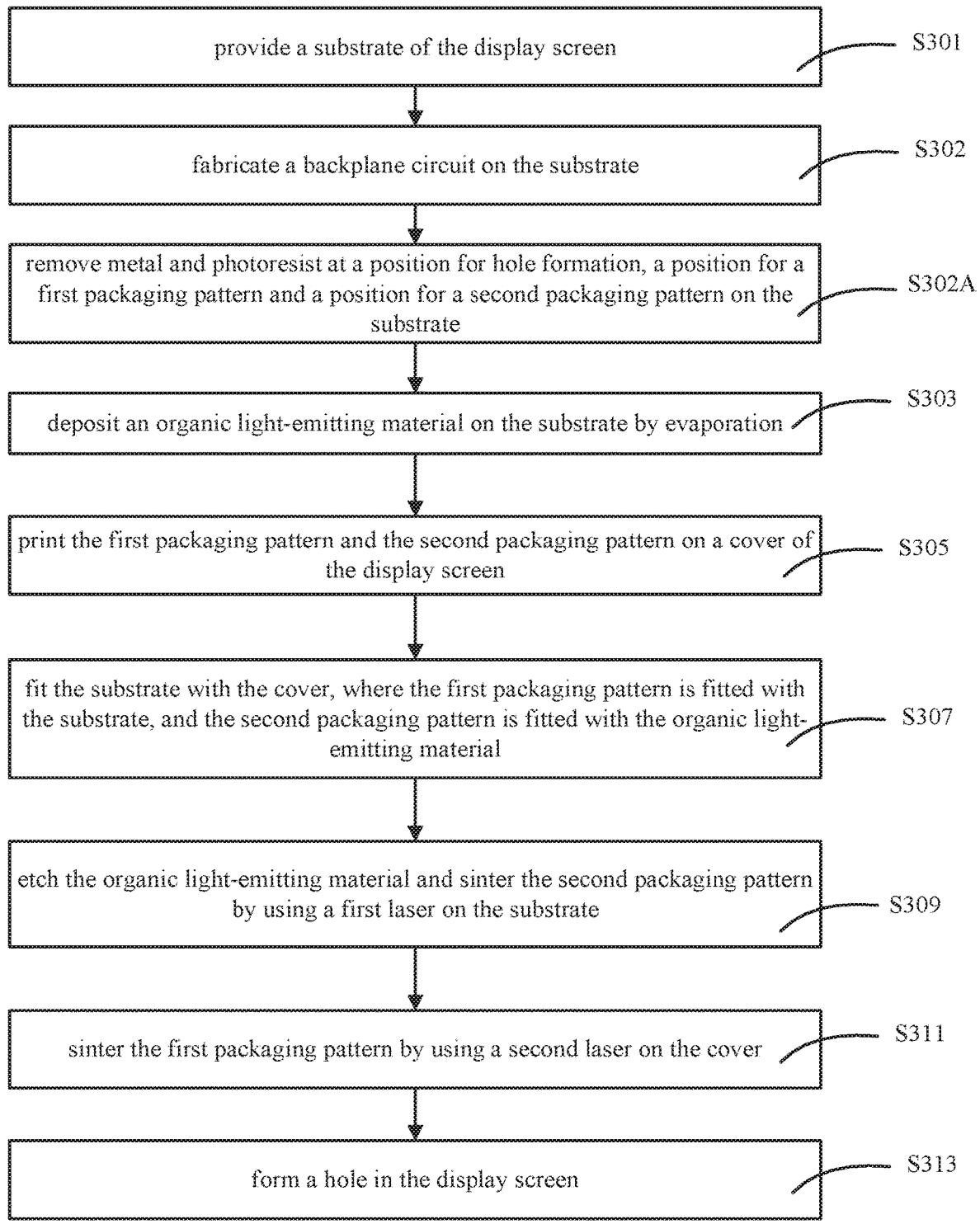
FIG. 13 is another flowchart of the packaging method of a display screen according to the third embodiment of the present disclosure.

As shown in FIG. 13, after the step S302 of fabricating the backplane circuit on the substrate 100, the packaging method further comprises: step S302A, removing metal and photoresist at a position for formation of the hole, a position of the first packaging pattern 210 and a position of the second packaging pattern 220 on the substrate 100, so that the first packaging pattern 210 and the second packaging pattern 220 are better printed on the cover 200.

In the above-described packaging method of the display screen 10, first, the substrate 100 of the display screen 10 is provided; then, the organic light-emitting material is deposited on the substrate 100 by evaporation; then, the first packaging pattern 210 and the second packaging pattern 220 are printed on the cover 200 of the display screen 10; then, the substrate 100 is fitted with the cover 200, so that the first packaging pattern 210 is fitted with the substrate 100 and the second packaging pattern 220 is fitted with the organic light-emitting material; then, the organic light-emitting material is etched and the second packaging pattern 220 is sintered both by using the first laser 20 on the substrate 10, so that the second packaging pattern 220 is in closer contact with the organic light-emitting material; then, the first packaging pattern 210 is sintered by using the second laser 30 on the cover 200, so that the first packaging pattern is in close contact with the substrate 100; finally, the hole 12 is formed in the display screen 10 to manufacture drilled AMOLED display products. The first packaging pattern 210 is fitted with the substrate 100, and the second packaging pattern 220 is fitted with the organic light-emitting material. Because the adhesion between the first packaging pattern 210 and the substrate 100 is better, the adhesion between the substrate 100 and the cover 200 is better, and water vapor and oxygen cannot easily pass between the first packaging pattern 210 and the substrate 100. In addition, since the first packaging pattern 210 surrounds the second packaging pattern 220, the problem of easy transmission of water vapor and oxygen between the packaging layer and the organic material is solved, so that the reliability of the display screen 10 is high.

A display screen 10 that is packaged by applying the above-described packaging method of a display screen 10 is also provided in the present disclosure. Since the adhesion between the substrate 100 and the cover 200 of the display screen 10 manufactured by the above-described packaging method of the display screen 10 is better, water vapor and oxygen cannot easily pass between the first pattern and the substrate 100. In addition, since the first packaging pattern 210 surrounds the second packaging pattern 220, the problem of easy transmission of water vapor and oxygen between the packaging layer and the organic material is solved, so that the reliability of the display screen 10 is high. Therefore, the above-described display screen 10 has a hole, which solves the problem that conventional AMOLED display packaging method cannot manufacture drilled AMOLED display products. In this embodiment, the display screen 10 is an AMOLED display screen. In other embodiments, the display screen 10 may also be an effect transistor display screen.

The AMOLED display screen includes a substrate, a light-emitting layer, a cover, a first packaging pattern and a second packaging pattern. The substrate is provided with a first via. The cover is provided with a second via connected with the first via, and the first via connects with the second via to form a hole 12. The light-emitting layer is disposed on the substrate, the first packaging pattern is disposed on the cover and is fitted with the substrate, and the second packaging pattern is disposed on the cover and is fitted with the light-emitting layer. The second packaging pattern surrounds the second via, and the first packaging pattern surrounds the second packaging pattern. For example, the first packaging pattern and the second packaging pattern are both glass powder packaging layers. For example, both of the first packaging pattern and the second packaging pattern are shadowless glue packaging layers. In order to further improve the sealing performance of the AMOLED display screen, a side surface of the first packaging pattern facing away from the second packaging pattern is coated with an adhesive layer, for example. The adhesive layer is adhered to the cover and the substrate, so that the connection between the cover and the substrate is closer, thereby improving the sealing performance of the AMOLED display screen.

In order to firmly connect the light-emitting layer to the substrate, in one embodiment, the light-emitting layer is an organic light-emitting layer. The light emitting layer is adhered to the substrate, so that the light-emitting layer and the substrate are firmly connected with each other. In this embodiment, the organic light-emitting layer is an organic light-emitting material. In order to ensure the tightness of the connection between the first packaging pattern and the cover, in one embodiment, the first packaging pattern is adhered to the cover so that the first packaging pattern and the cover are closely connected with each other, thereby preventing water vapor or oxygen from entering through the gap between the first packaging pattern and the cover. In order to ensure the tightness of the connection between the second packaging pattern and the cover, in one embodiment, the second packaging pattern is adhered to the cover so that the second packaging pattern and the cover are closely connected with each other, thereby preventing water vapor or oxygen from entering through the gap between the second packaging pattern and the cover.

In one embodiment, the first packaging pattern and the second packaging pattern are both annular, and a center of the first packaging pattern coincides with a center of the second packaging pattern. In one embodiment, a diameter of the first packaging pattern is larger than a diameter of the second packaging pattern. Since the first packaging pattern surrounds the second packaging pattern and the first packaging pattern is fitted with the substrate, it is difficult for water vapor or oxygen to pass between the first packaging pattern and the substrate, which prevents water vapor or oxygen from entering between the second packaging pattern and the organic material. In one embodiment, the second packaging pattern and the light-emitting layer are both annular, and the center of the second packaging pattern coincides with a center of the light-emitting layer. In one embodiment, the diameter of the second packaging pattern is equal to a diameter of the light-emitting layer, and the center of the second packaging pattern coincides with the center of the light-emitting layer, so that the first packaging pattern is in close contact with the light-emitting layer. It can be understood that the first packaging pattern and the second packaging pattern are not limited to being annular. For example, the first packaging pattern and the second packaging pattern may also have a square shape or an oval ring shape or other shapes. In one embodiment, the first via and the second via are both circular holes. A diameter of the second via is smaller than the diameter of the second packaging pattern, so that the second packaging pattern surrounds the second via. When packaging, pointers can be installed in the first via and the second via, so as to meet requirements of drilled AMOLED products. In one embodiment, the first via and the second via are both circular holes. The first via corresponds to the second via, and the diameter of the first via is equal to the diameter of the second via, thereby simplifying the manufacturing process of the AMOLED display screen and reducing the cost of AMOLED display screens.

In the AMOLED display screen described above, the light-emitting layer is disposed on the substrate, and the second packaging pattern is disposed on the cover and fitted with the light-emitting layer, so that the second packaging pattern is in contact with the light-emitting layer. Since the first packaging pattern is disposed on the cover and is fitted with the substrate, the first packaging pattern is in close contact with the substrate. In addition, since the first packaging pattern surrounds the second packaging pattern, it is difficult for water vapor or oxygen to pass between the first packaging pattern and the substrate, thereby preventing water vapor or oxygen from entering between the second packaging pattern and the organic material. Therefore, the problem that water vapor or oxygen and the like easily penetrate the gap between the packaging layer and the organic material is solved, and the adhesion between the substrate and the cover of the display screen is better and the reliability is higher. The first via is provided in the substrate, the second via connecting with the first via is provided in the cover, and the second packaging pattern surrounds the second via. Both the first via and second via can be used to mount a pointer, so that the AMOLED display screen can meet requirements of a drilled AMOLED product, such as a watch or a clock.

The technical features of the embodiments described above can be arbitrarily combined. In order to simplify the description, all possible combinations of the technical features in the above embodiments have not been described. However, as long as there is no contradiction in the combination of these technical features, it should be considered as the scope described in this specification.

The above-described embodiments only express several implementations of the present disclosure, and their descriptions are more specific and detailed, but they cannot be understood as limiting the scope of the present disclosure. It should be noted that, for those of ordinary skill in the art, numerous modifications and improvements can be made without departing from the concept of the present disclosure, which all fall within the protection scope of the present disclosure. Therefore, the protection scope of the present disclosure shall be best defined by the appended claims.

The invention claimed is:

1. A packaging method of a display screen, comprising:
providing a substrate of the display screen;
depositing an organic light-emitting material on the substrate by evaporation;
printing a first packaging pattern and a second packaging pattern on a cover of the display screen, wherein the first packaging pattern surrounds the second packaging pattern;
etching the organic light-emitting material by using a first laser on the substrate;
fitting the substrate with the cover, wherein the first packaging pattern is fitted with the substrate, and the second packaging pattern is fitted with the organic light-emitting material;
sintering the first packaging pattern and the second packaging pattern by using a second laser on one of the substrate and the cover; and
forming a hole in the display screen.

2. The packaging method of a display screen according to claim 1, wherein the first packaging pattern and the second packaging pattern are sintered by using the second laser on the cover.

3. The packaging method of a display screen according to claim 2, wherein the first packaging pattern and the second packaging pattern are sintered by using the second laser on a bottom surface of the cover facing away from the substrate.

4. The packaging method of a display screen according to claim 1, wherein before the step of depositing the organic light-emitting material on the substrate by evaporation, the packaging method further comprises:
fabricating a backplane circuit on the substrate.

5. The packaging method of a display screen according to claim 1, wherein the first packaging pattern and the second packaging pattern are both annular, and the second packaging pattern surrounds the hole of the display screen.

6. A display screen, wherein the display screen is packaged by using the packaging method of a display screen according to claim 1.

7. A packaging method of a display screen, comprising:
providing a substrate of the display screen;
depositing an organic light-emitting material on the substrate by evaporation;
printing a first packaging pattern and a second packaging pattern on a cover of the display screen, wherein the first packaging pattern surrounds the second packaging pattern;
fitting the substrate with the cover, wherein the first packaging pattern is fitted with the substrate, and the second packaging pattern is fitted with the organic light-emitting material;
etching the organic light-emitting material by using a first laser on the substrate;
sintering the first packaging pattern and the second packaging pattern by using a second laser on one of the substrate and the cover; and
forming a hole in the display screen.

8. The packaging method of a display screen according to claim 7, wherein the first laser acts on a bottom surface of the substrate facing away from the cover.

9. The packaging method of a display screen according to claim 7, wherein the second laser acts on a bottom surface of the cover facing away from the substrate.

10. The packaging method of a display screen according to claim 7, wherein before the step of depositing the organic light-emitting material on the substrate by evaporation, the packaging method further comprises:
fabricating a backplane circuit on the substrate.

11. The packaging method of a display screen according to claim 10, wherein after the step of fabricating the backplane circuit on the substrate, the packaging method further comprises:
removing metal and photoresist at a position for formation of the hole, a position for the first packaging pattern and a position for the second packaging pattern on the substrate.

12. The packaging method of a display screen according to claim 7, wherein the first packaging pattern and the second packaging pattern are both annular, and the second packaging pattern surrounds the hole of the display screen.

13. A display screen, wherein the display screen is packaged by using the packaging method of a display screen according to claim 7.

14. A packaging method of a display screen, comprising:
providing a substrate of the display screen;
depositing an organic light-emitting material on the substrate by evaporation;
printing a first packaging pattern and a second packaging pattern on a cover of the display screen, wherein the first packaging pattern surrounds the second packaging pattern;
fitting the substrate with the cover, wherein the first packaging pattern is fitted with the substrate, and the second packaging pattern is fitted with the organic light-emitting material;
etching the organic light-emitting material and sintering the second packaging pattern by using a first laser on the substrate;
sintering the first packaging pattern by using a second laser on the cover; and
forming a hole in the display screen.

15. The packaging method of a display screen according to claim 14, wherein the first laser acts on a bottom surface of the substrate facing away from the cover.

16. The packaging method of a display screen according to claim 14, wherein the second laser acts on a bottom surface of the cover facing away from the substrate.

17. The packaging method of a display screen according to claim 14, wherein before the step of depositing the organic light-emitting material on the substrate by evaporation, the packaging method further comprises:
fabricating a backplane circuit on the substrate.

18. The packaging method of a display screen according to claim 17, wherein after the step of fabricating the backplane circuit on the substrate, the packaging method further comprises:
removing metal and photoresist at a position for formation of the hole, a position for the first packaging pattern and a position for the second packaging pattern on the substrate.

19. The packaging method of a display screen according to claim 14, wherein the first packaging pattern and the second packaging pattern are both annular, and the second packaging pattern surrounds the hole of the display screen.

20. A display screen, wherein the display screen is packaged by using the packaging method of a display screen according to claim 14.

* * * * *